(12) United States Patent
Tomohiro et al.

(10) Patent No.: US 10,971,310 B2
(45) Date of Patent: Apr. 6, 2021

(54) ELECTRONIC COMPONENT

(71) Applicant: Murata Manufacturing Co., Ltd., Nagaokakyo (JP)

(72) Inventors: Takashi Tomohiro, Nagaokakyo (JP); Kazumasa Fujimoto, Nagaokakyo (JP); Tomoki Nobuta, Nagaokakyo (JP)

(73) Assignee: MURATA MANUFACTURING CO., LTD, Nagaokakyo (JP)

( * ) Notice: Subject to any disclaimer, the term of this patent is extended or adjusted under 35 U.S.C. 154(b) by 183 days.

(21) Appl. No.: 16/429,232

(22) Filed: Jun. 3, 2019

(65) Prior Publication Data
US 2019/0287727 A1    Sep. 19, 2019

Related U.S. Application Data

(63) Continuation of application No. PCT/JP2017/041617, filed on Nov. 20, 2017.

(30) Foreign Application Priority Data

Dec. 5, 2016  (JP) .............................. JP2016-235791

(51) Int. Cl.
| | |
|---|---|
| *H01G 4/35* | (2006.01) |
| *B32B 15/08* | (2006.01) |
| *H01F 17/00* | (2006.01) |
| *H01G 4/018* | (2006.01) |
| *H01G 4/224* | (2006.01) |
| *H01G 4/38* | (2006.01) |
| *H01G 4/40* | (2006.01) |
| *H05K 1/02* | (2006.01) |
| *H03H 1/00* | (2006.01) |

(52) U.S. Cl.
CPC ............... *H01G 4/35* (2013.01); *B32B 15/08* (2013.01); *H01F 17/0006* (2013.01); *H01G 4/018* (2013.01); *H01G 4/224* (2013.01); *H01G 4/38* (2013.01); *H01G 4/40* (2013.01); *H05K 1/0201* (2013.01); *H01F 2017/0026* (2013.01); *H03H 2001/0085* (2013.01)

(58) Field of Classification Search
CPC .................................. H01G 4/28; H01G 4/35
See application file for complete search history.

(56) References Cited

FOREIGN PATENT DOCUMENTS

| JP | S637612 A | 1/1988 |
|---|---|---|
| JP | S63177025 U | 11/1988 |
| JP | H01122622 U | 8/1989 |

(Continued)

OTHER PUBLICATIONS

International Search Report issued in PCT/JP2017/041617, dated Jan. 30, 2018.

(Continued)

*Primary Examiner* — Eric W Thomas
(74) *Attorney, Agent, or Firm* — Arent Fox LLP

(57) ABSTRACT

An electronic component includes a component base body and first and second outer electrodes covering respective end faces of the component base body. The component base body includes an element main body and a magnetic body portion covering the element main body. The element main body includes a linear inner conductor, a dielectric layer covering the periphery of part of the inner conductor, and a conductor layer formed to cover the dielectric layer.

16 Claims, 11 Drawing Sheets

(56) References Cited

FOREIGN PATENT DOCUMENTS

| JP | H03125519 U | 12/1991 |
| JP | H0427614 U | 3/1992 |
| JP | H0528751 A | 2/1993 |
| JP | 2006005309 A * | 1/2006 |

OTHER PUBLICATIONS

Written Opinion of the International Searching Authority issued in PCT/JP20171041617, dated Jan. 30, 2018.

* cited by examiner

FIG. 6(a)
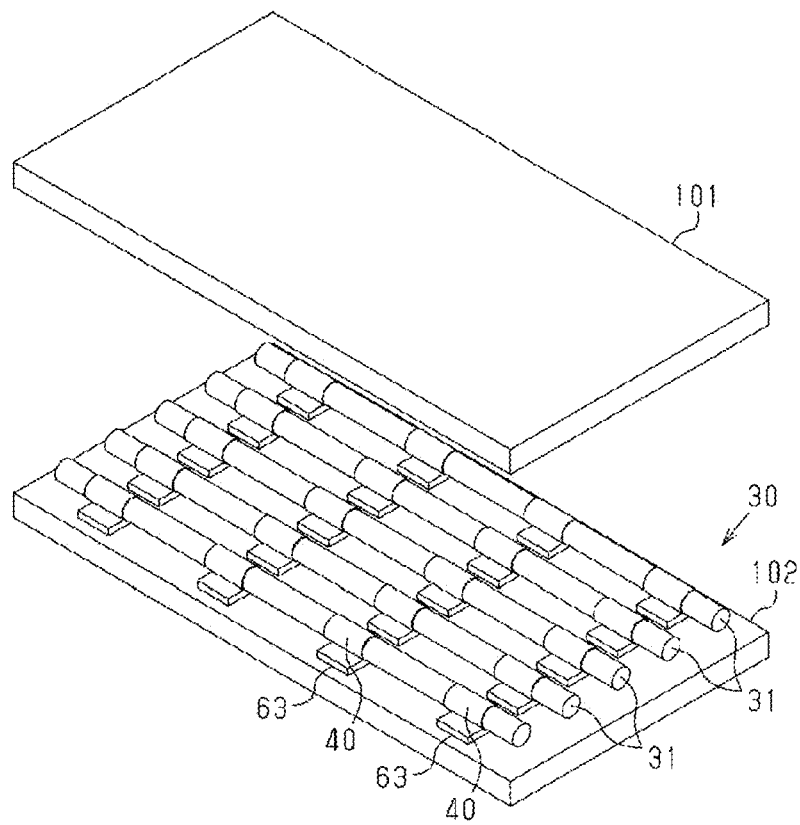
FIG. 6(b)
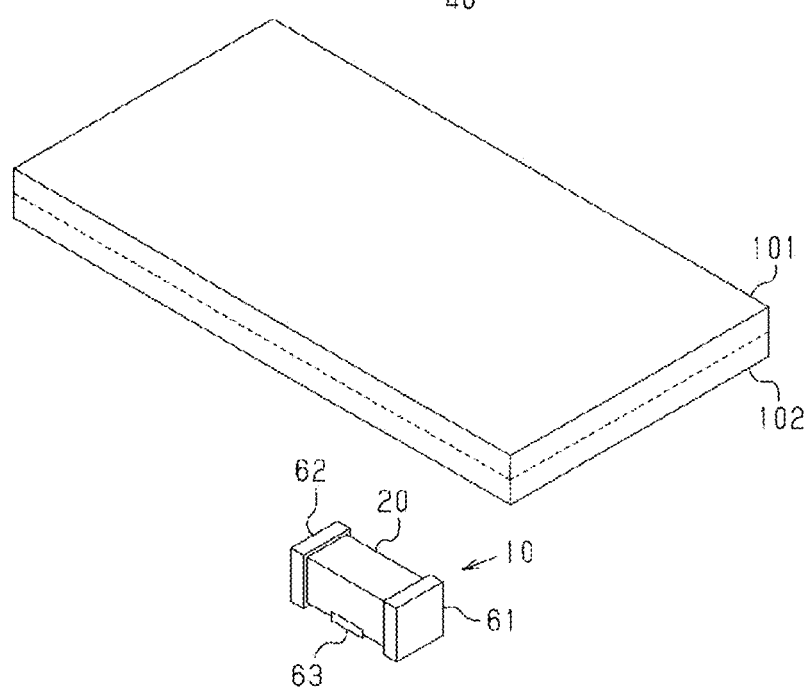
FIG. 6(c)

ELECTRONIC COMPONENT

CROSS REFERENCE TO RELATED APPLICATIONS

The present application is a continuation of International application No. PCT/JP2017/041617, filed Nov. 20, 2017, which claims priority to Japanese Patent Application No. 2016-235791, filed Dec. 5, 2016, the entire contents of each of which are incorporated herein by reference.

TECHNICAL FIELD

The present invention relates to an electronic component.

BACKGROUND OF THE INVENTION

Hitherto, there has been proposed an electronic component including a cylindrical feed-through capacitor, a central conductor inserted in the feed-through capacitor, ferrite beads through which the central conductor is inserted, and metal caps connected to both end portions of the central conductor (for example, see Japanese Examined Utility Model Registration Application Publication No. 5-28751, hereinafter, Patent Document 1). This electronic component functions as an LC composite filter with the inductor components of the central conductor and the feed-through capacitor.

An electronic component such as the above is typically formed by inserting a through-feed capacitor and ferrite beads into a central conductor, processing metal caps, and welding the metal caps with the central conductor. Thus, in the case of miniaturization, the individual members become smaller, and there is a possibility that desired characteristics are not achieved.

An object of the present invention is to solve the above-mentioned problem, and to provide an electronic component capable of achieving desired characteristics even when the electronic component is miniaturized.

BRIEF SUMMARY OF THE INVENTION

An electronic component for solving the above-mentioned problem includes: a linear inner conductor; a dielectric layer formed on a surface of the inner conductor; a conductor layer formed to cover the dielectric layer; a magnetic body portion formed to cover periphery of the inner conductor and the conductor layer; a first outer electrode and a second outer electrode electrically coupled to both end faces of the inner conductor; and a third outer electrode electrically coupled to the conductor layer.

According to this configuration, the dielectric layer and the conductor layer covering the periphery of part of the inner conductor, and the body portion of the inner conductor covered by the dielectric layer and the conductor layer function as a capacitor. In addition, the magnetic body portion and conductor portions of the inner conductor covered by the magnetic body portion function as inductors. Therefore, the electronic component is an LC composite component including a capacitor and inductors. The capacitance value of the capacitor is determined by the size of the inner conductor, the dielectric layer, and the conductor layer. For this reason, the electronic component, that is, the capacitance value of the capacitor, does not depend on the size of the electronic component. Therefore, even when the electronic component is miniaturized, it is not necessary to reduce the size of the dielectric layer and the conductor layer, and desired characteristics can be obtained. In addition, because the conductor layer is covered by a magnetic body, external physical stress is unlikely to be applied to the conductor layer.

In the above-described electronic component, it is preferable that the dielectric layer be an oxide film obtained by oxidizing the inner conductor.

According to this configuration, the dielectric layer can be easily formed around the inner conductor. In addition, because the oxide film is formed by oxidation, the dielectric layer can be formed with a substantially uniform thickness around the inner conductor.

In the above-described electronic component, it is preferable that the magnetic body portion be a composite material containing magnetic material powder and thermosetting resin.

According to this configuration, because the magnetic body portion can be formed by heat processing, an assembly process as in the case of ferrite beads becomes unnecessary. In addition, the inner conductor and the conductor layer can be covered by the magnetic body portion without gaps by performing heat processing after burying the inner conductor and the like in the composite material.

In the above-described electronic component, it is preferable that the inner conductor include a core portion extending in an axial direction of the inner conductor, and a porous portion having numerous pores formed around at least part of the core portion; and it is preferable that the dielectric layer be formed to cover the porous portion.

According to this configuration, because the dielectric layer is formed on the surface of the porous portion having the numerous pores, the area of contact between the dielectric layer and the inner conductor becomes greater, thereby making it possible to increase the capacitance value of the capacitor.

In the above-described electronic component, it is preferable that the conductor layer include a conductive polymer layer formed to cover the dielectric layer, and a conductive resin layer connected to the third outer electrode.

According to this configuration, because the conductive polymer layer fills the numerous pores of the porous portion, the area of contact between the conductive polymer layer and the dielectric layer becomes greater, thereby making it possible to increase the capacitance value of the capacitor.

It is preferable that the above-described electronic component include an insulating layer covering periphery of the inner conductor from the conductor layer to an end portion of the inner conductor, and it is preferable that the magnetic body portion be formed to cover the conductor layer and the insulating layer.

In the above-described electronic component, it is preferable that the magnetic body portion include a pair of end faces that expose both end faces of the inner conductor, and side faces adjacent to the pair of end faces; it is preferable that the first outer electrode and the second outer electrode include end-face electrodes covering the end faces, and side-face electrodes that cover part of the side faces and that are continuously formed with the end-face electrodes; and it is preferable that the dielectric layer be formed not to overlap the side-face electrodes in a direction orthogonal to the side faces.

According to this configuration, in the case where the dielectric layer and each of the side-face electrodes overlap, a parasitic capacitor is generated in that portion. Because a parasitic capacitor causes RF noise to pass from the first outer electrode or the second outer electrode to the dielectric layer, the inductance value of the inductor is reduced. For this reason, a parasitic capacitor is unlikely to be generated since the dielectric layer and each of the side-face electrodes do not overlap, and reduction of the inductance value can be suppressed.

In the above-described electronic component, it is preferable that the conductor layer be arranged to be in contact with the third outer electrode, and it is preferable that the inner conductor be bent such that both end faces of the inner conductor are positioned at center of the first outer electrode and the second outer electrode.

According to this configuration, the electrical distance between the conductor layer and the third outer electrode, which function as a capacitor, is made shorter since the conductor layer and the third outer electrode are in contact with each other, thereby minimizing the equivalent series inductance. In addition, a parasitic capacitor is unlikely to be generated since the end portions of the inner conductor are separated from the side-face electrodes of the first outer electrode and the second outer electrode, and reduction of the inductance value can be suppressed.

Advantageous Effects of Invention

According to an electronic component of the present invention, desired characteristics can be achieved even when the electronic component is miniaturized.

BRIEF DESCRIPTION OF DRAWINGS

FIGS. 6(a) to 6(c) are schematic perspective views illustrating an electronic component manufacturing process.

DESCRIPTION OF PREFERRED EMBODIMENTS

Note that the accompanying drawings may illustrate elements in an enlarged manner in order to facilitate the understanding. The dimensional ratios of the elements may differ from the actual ones, or from ones in other drawings. In addition, the cross-sectional views may omit hatching of some elements in order to facilitate the understanding.

Figure 1A:
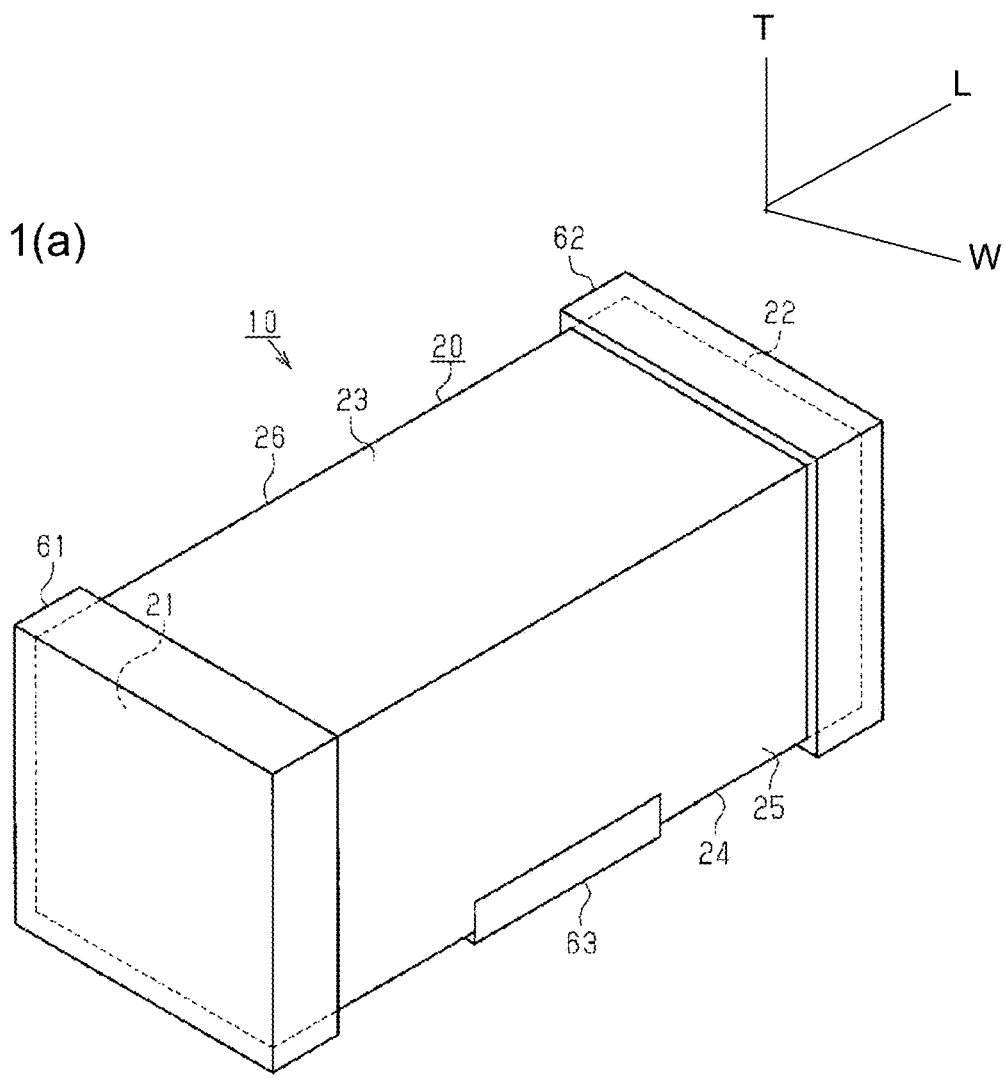
FIG. 1(a) is a perspective view illustrating an electronic component.

Referring now to the drawings wherein like numerals indicate like elements, FIG. 1(a) illustrates an electronic component 10 includes a component base body 20, and first and second outer electrode 61 and 62 formed on the surface of the component base body 20. The component base body 20 includes a third outer electrode 63.

The component base body 20 is preferably formed in a substantially rectangular parallelepiped shape. For example, the component base body 20 is formed in a substantially square shape as viewed in cross section. Note that a "substantially rectangular parallelepiped shape" includes a rectangular parallelepiped whose corners and ridgelines are chamfered, and a rectangular parallelepiped whose corners and ridgelines are rounded.

When mounted on a mounting target (such as a wiring substrate), the electronic component 10 is arranged facing the third outer electrode 63 toward the mounting target. The electronic component 10 will be described with the assumption that the electronic component 10 is arranged on the top face of the mounting target. For convenience of description, the directions indicated by the coordinate system shown in FIG. 1(a) will be referred to as the length direction L, the height direction T and the width direction W. The length direction L, the height direction T and the width direction W are all orthogonal to one another.

The component base body 20 has opposing end faces 21 and 22 which are spaced from each other in the length direction L and which lie perpendicular to the length direction L. Side faces 25 and 26 and top and bottom faces 23 and 24 all extend perpendicular to the end faces 21 and 22. Top and bottom faces 23 and 24 oppose one another, are spaced apart in the height direction T and lie perpendicular to the thickness direction T. Side faces 25 and 26 oppose one another, are spaced apart in the width direction W and lie perpendicular to the width direction W.

Figure 1B:
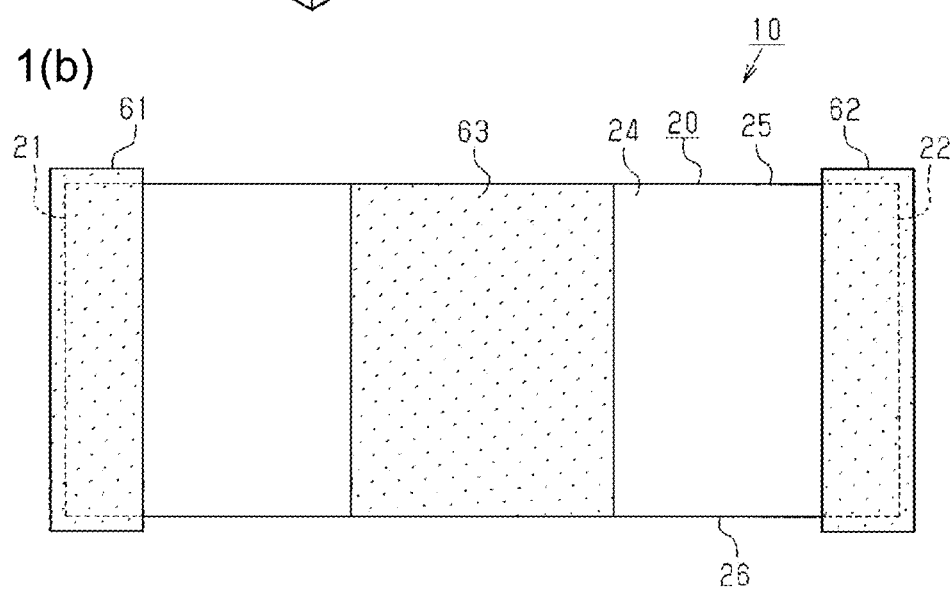
FIG. 1(b) is a bottom view of the electronic component.

The first outer electrode 61 is preferably formed to cover the end face 21 of the component base body 20 and part of the side faces 25 and 26, the top face 23, and the bottom face 24, and to be continuous from the side face 21. Similarly, the second outer electrode 62 is preferably formed to cover the end face 22 of the component base body 20 and part of the side faces 25 and 26, the top face 23, and the bottom face 24, and to be continuous from the side face 22. As illustrated in FIG. 1(b), the third outer electrode 63 is preferably formed in a rectangular shape extending along the width direction W at substantially the center in the length direction L on the bottom face 24 of the component base body 20.

Figure 2A:
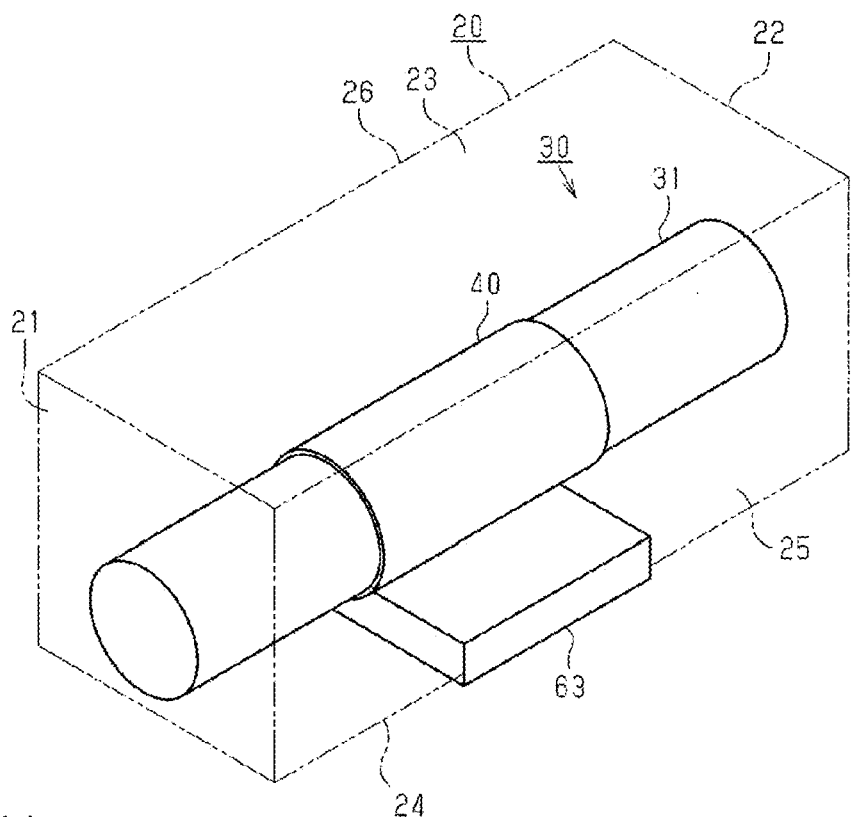
FIG. 2(a) is a perspective view illustrating a schematic structure of a component base body.
Figure 2B:
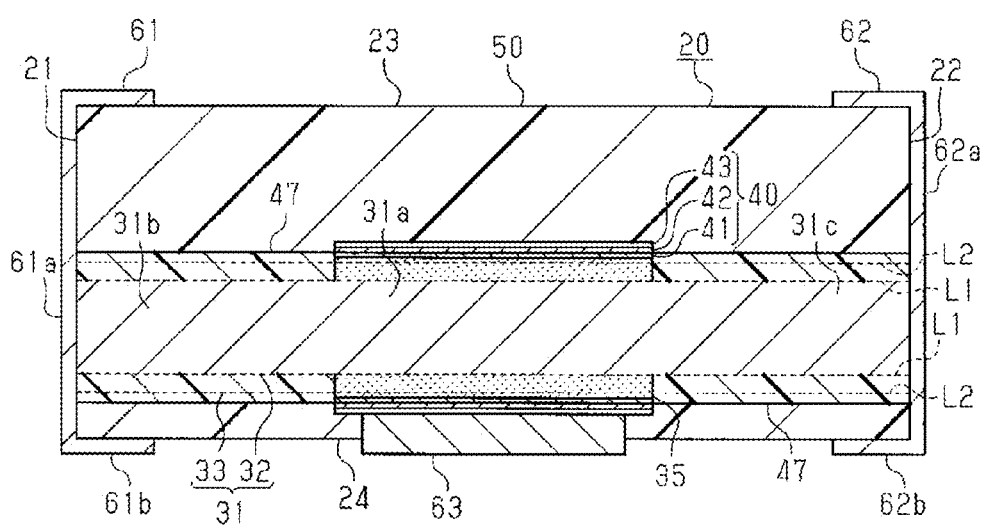
FIG. 2(b) is a cross-sectional view of the electronic component.

As illustrated in FIGS. 2(a) and 2(b), the component base body 20 includes an element main body 30, and a magnetic body portion 50 covering the element main body 30.

The element main body 30 includes a linear inner conductor 31. As the material of the inner conductor 31, one that enables an oxide film to function as a dielectric layer is preferable. As the material of the inner conductor 31, for example, aluminum (Al), tantalum (Ta), or an alloy containing at least one of aluminum (Al) and tantalum (Ta) can be used. In the present embodiment, the inner conductor 31 is formed in a linear shape whose cross section is circular. In the present embodiment, an aluminum wire is used as the inner conductor 31. The aluminum wire is preferable since it is cheap and easy to obtain. The cross-sectional diameter of the inner conductor 31 may be, for example, 0.3 mm to 0.8 mm.

The inner conductor 31 includes a core portion 32 extending in the axial direction (length direction L) of the inner conductor 31, and a porous portion 33 formed around the core portion 32. The porous portion 33 has many pores. The porous portion 33 may be obtained by applying etching to the entire peripheral surface of the inner conductor 31, which includes, for example, an aluminum wire, and roughening the whole peripheral surface by the etching.

Figure 3:
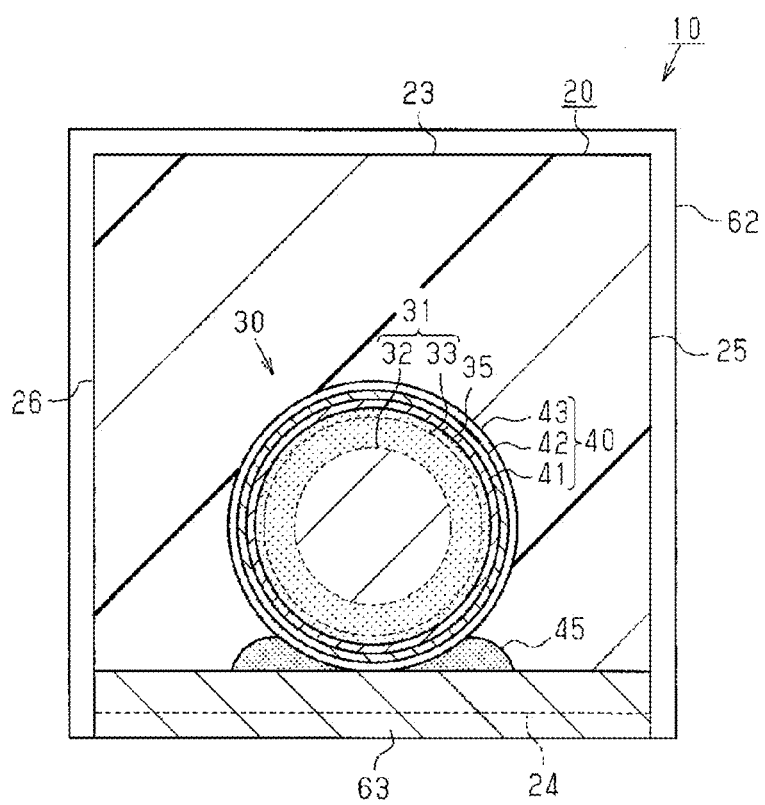
FIG. 3 is a cross-sectional view illustrating the outline of an inner conductor.
Figure 4A:
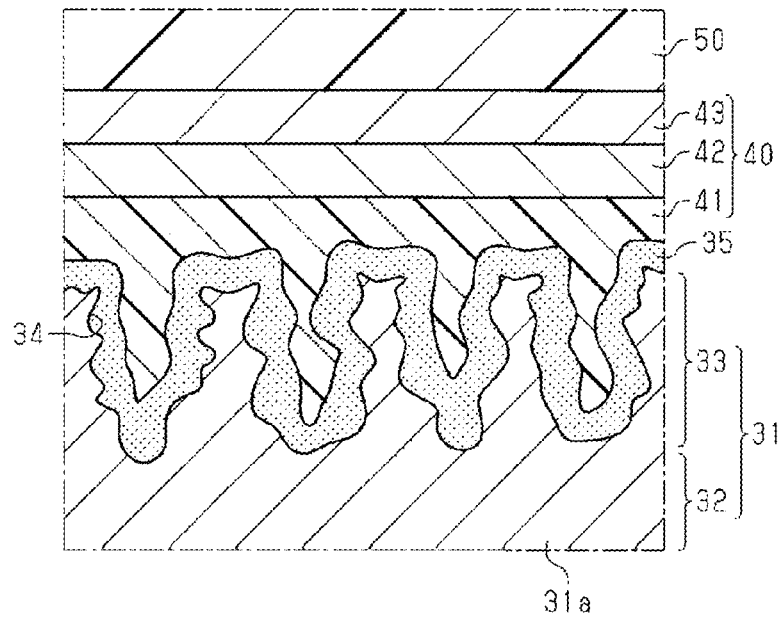
FIGS. 4(a) and 4(b) are enlarged cross-sectional views schematically illustrating part of the inner conductor.
Figure 4B:
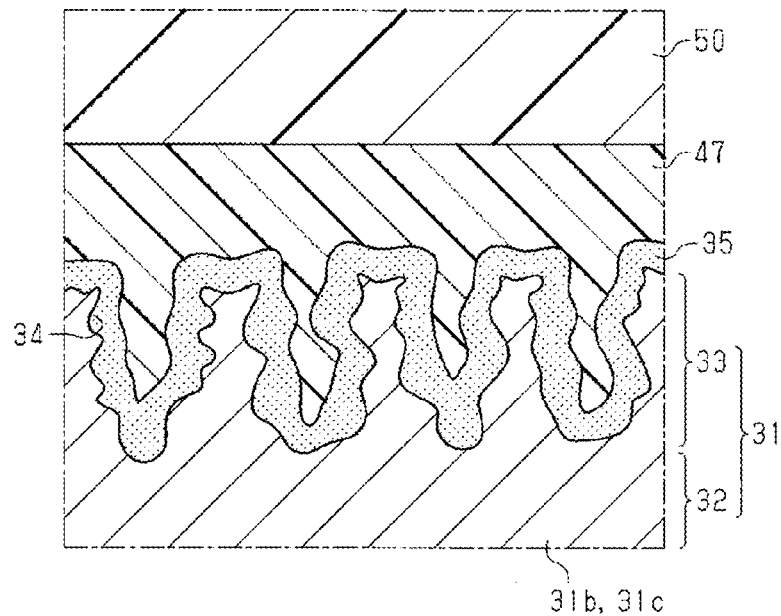

As illustrated in FIGS. 4(a) and 4(b), the porous portion 33 is formed with many pores 34 that are open toward outside in the radial direction. Note that the porous portion 33 is illustrated in FIGS. 2(b) and 3 by an area sandwiched by broken lines L1 and L2. In the area sandwiched by broken lines L1 and L2, hatching is changed in accordance with a member filling the pores 34 (see FIGS. 4 (a) and 4(b)).

As illustrated in FIG. 3, the element main body 30 includes a dielectric layer 35 formed around the inner conductor 31. The dielectric layer 35 is, for example, an oxide film. For example, when the inner conductor 31 is an aluminum wire, the dielectric layer 35 can be alumina ($Al_2O_3$). The dielectric layer 35 is obtained, for example, by oxidizing the surface of the inner conductor 31 where the porous portion 33 is formed. The oxide film is formed on the surface of the porous portion 33. Therefore, as illustrated in FIGS. 4(a) and 4(b), the oxide film is formed inside the pores 34 to cover the inner surface of the pores 34. By way of example, the porous portion 33 is formed all around the inner conductor 31.

As illustrated in FIGS. 2(a), 2(b), and 3, the element main body 30 includes a conductor layer 40. In the present embodiment, the conductor layer 40 is formed in a cylindrical shape that covers the periphery of part of the inner conductor 31 and is formed in a central portion of the inner conductor 31 in the axial direction (length direction L) of the inner conductor 31.

The conductor layer 40 is preferably formed not to overlap the first and second outer electrodes 61 and 62 in a direction perpendicular to the mounting face. More specifically, and as best shown in FIG. 2(b), the first outer electrode 61 preferably includes an end-face electrode 61a which covers the entire end face 21 of the component base body 20, and a side-face electrode 61b which covers a portion of the side faces 25 and 26 and the top and bottom faces 23 and 24. Similarly, the second outer electrode 62 includes an end-face electrode 62a, which covers the entire end face 22 of the component base body 20, and a side-face electrode 62b, which covers a portion of the side faces 25, 26 and the top and bottom faces 23 and 24. The conductor layer 40 is formed not to overlap the side-face electrodes 61b and 62b.

The electronic component 10 is arranged, for example, the third outer electrode 63 facing a mounting target. In other words, the bottom face 24 of the element main body 30 is arranged parallel to the mounting face. Therefore, the conductor layer 40 is formed not to overlap the side-face electrodes 61b and 62b of the first and second outer electrodes 61 and 62 as viewed in a direction perpendicular to the bottom face 24.

The conductor layer 40 preferably includes a conductive polymer layer (conductive polymer) 41, a carbon layer 42, and a conductive resin layer 43.

As illustrated in FIG. 4(a), the conductive polymer layer 41 is provided to fill the pores 34 of the porous portion 33. In doing so, the conductive polymer layer 41 and the dielectric layer 35 can be made to contact each other over a wide area. The conductive resin layer 43 may be, for example, a resin including a conductive filler such as silver. The thermosetting resin may be, for example, a polyimide or epoxy resin. Note that the configuration of the conductor layer 40 can be changed as appropriate, and, for example, the carbon layer 42 may be omitted.

As illustrated in FIG. 3, the conductor layer 40 is electrically coupled to the third outer electrode 63 with a bonding material 45 interposed therebetween. The third outer electrode 63 is preferably made of a metal plate. The third outer electrode 63 may be made, for example, of copper or a copper alloy. The bonding material 45 may be, for example, a conductive adhesive, solder, or the like.

As shown, for example, in FIG. 2(b), the element main body 30 preferably includes an insulating layer 47 formed around the inner conductor 31 except for the conductor layer 40. The insulating layer 47 may, for example, be made of a thermosetting resin such as polyimide or epoxy resin. As illustrated in FIG. 4(b), the insulating layer 47 is preferably formed to fill the pores 34 of the porous portion 33. In other words, the insulating layer 47 is preferably formed to cover the dielectric layer 35.

The element main body 30 is buried in the magnetic body portion 50. The magnetic body portion 50 is preferably made of a composite material (composite) containing magnetic material powder and resin. The magnetic material powder can be, for example, a metal such as iron, or powder such as ferrite. The magnetic material powder may be a mixture of two or more powders of different particle sizes or different compositions. The resin may be, for example, a thermosetting resin such as polyimide resin or epoxy resin. Note that the magnetic body portion 50 may include a filler such as alumina or silica. It is preferable to select and use desired magnetic materials and fillers in accordance with the desired function of the device.

Both end faces of the core portion 32 of the inner conductor 31 are exposed from the magnetic body portion 50 on the end faces 21 and 22 of the component base body 20. The inner conductor 31 exposed in this manner is electrically coupled to the first and second outer electrodes 61 and 62.

The first and second outer electrodes 61 and 62 may, for example, be a plating film including metal such as nickel, zinc (Zn), copper (Cu), tin (Sn), gold (Au), silver (Ag), or palladium (Pd), or an alloy containing at least one of these metals. Note that the first outer electrode 61 and the second outer electrode 62 may be a conductive resin film including at least one of Ag, Cu, nickel (Ni), Sn, and Pd as a conductive component. Alternatively, the first outer electrode 61 and the second outer electrode 62 may be a multilayer structure including a plating film and a conductive resin film. For example, the first outer electrode 61 and the second outer electrode 62 may be one that includes two plating layers and a conductive resin film provided between these plating layers.

Next, a method of manufacturing the above-described electronic component will be described.

Figure 5A:
FIGS. 5(a) to 5(c) are schematic perspective views illustrating an electronic component manufacturing process.

First, an inner conductor 31, illustrated in FIG. 5(a), is formed. To this end, a linear wire rod, made for example of aluminum wire, is prepared. An etching processing is applied to the surface of the wire rod to form the porous portion 33 having the pores 34 illustrated in FIGS. 4(a) and 4(b). The dielectric layer 35 illustrated in FIGS. 4(a) and 4(b) is then formed by oxidation (such as anodic oxidation).

Figure 5B:
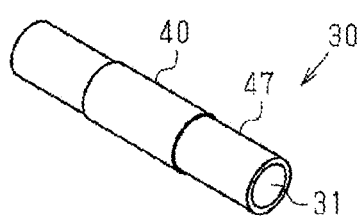

As illustrated in FIG. 5(b), the conductor layer 40 and the insulating layer 47 are formed on the dielectric layer to form the element main body 30. To this end, electrically insulating resin is preferably applied onto the peripheral surface of the inner conductor 31, and the resin is dried to form the insulating layer 47. Next, the conductor layer 40 is formed in a portion where the insulating layer 47 is not formed, on the peripheral surface of the inner conductor 31. In the present embodiment, as illustrated in FIG. 3, the conductor layer 40 includes the conductive polymer layer 41, the carbon layer 42, and the conductive resin layer 43. After the conductive polymer layer 41 is formed on the peripheral surface of the inner conductor 31, the carbon layer 42 and the conductive resin layer 43 are formed.

The conductive polymer layer 41 can be formed, for example, by applying a conductive polymer solution in which poly (3, 4-ethylenedioxythiophene) is dispersed as solid electrolyte onto the peripheral surface of the inner conductor 31, and then drying the solution. Note that the conductive polymer layer 41 can be formed by chemical oxidation polymerization in which a monomer which is a precursor of a polymer and a reaction solution containing a dopant and an oxidizing agent are alternately applied and polymerized, electrolytic polymerization in which electrochemical polymerization is performed in a reaction solution, or the like.

The carbon layer 42 can be formed by, for example, applying carbon paste and then drying the carbon paste. The conductive resin layer 43 can be formed by, for example, applying thermosetting resin containing a conductive filler such as Ag, heating the resin, and curing the resin.

Figure 5C:
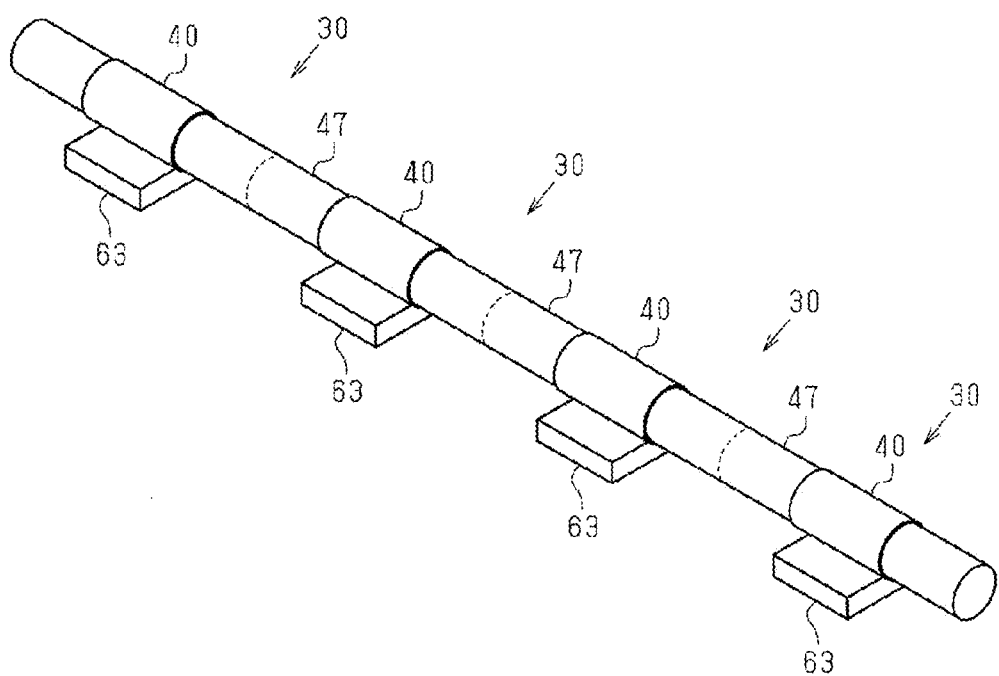

Note that FIGS. 5(a) and 5(b) illustrate the inner conductor 31 and the element main body 30 corresponding to one electronic component. In the manufacturing process, as illustrated in FIG. 5(c), it is preferable to form a plurality of element main bodies 30 in a continuous state. The third outer electrode 63 is bonded to the conductor layer 40 of each of these continuous element main bodies 30.

As illustrated in FIG. 6(a), two resin sheets 101 and 102 are prepared. These resin sheets 101 and 102 are preferably made of a composite material (composite) containing magnetic material powder and resin, and are semi-cured sheets. The continuous element main bodies 30 are arranged on the top face of the resin sheet 102. The resin sheet 101 is placed over the continuous element main bodies 30. As illustrated in FIG. 6(b), pressure is applied from above and below to the resin sheets 101 and 102 to cause them to be pressure-bonded with the continuous element main bodies 30 (illustrated in FIG. 6(a)) buried in the resin sheets 101 and 102. Next, the resin sheets 101 and 102 are heated at a certain temperature to be thermally cured.

After that, the bottom face of the resin sheet 102 is polished to expose the third outer electrode 63 (one for each of the individual main bodies).

Thereafter, the resin sheets 101 and 102 are cut with, for example, a dicing machine, to form singulated component base bodies 20 (see FIG. 2(a)). In this step of cutting the resin sheets 101 and 102, the above-mentioned continuous element main bodies 30 are cut at the same time. Therefore, the end faces of the inner conductor 31 are exposed on the cross section of each of the singulated component base bodies 20. The first outer electrode 61 and the second outer electrode 62 illustrated in FIG. 6(c) are formed on each singulated component base body 20.

Next, the operation of the above-described electronic component 10 will be described.

As illustrated in FIGS. 1(a) and 1(b), the electronic component 10 includes the component base body 20 and first and second outer electrodes 61 and 62 covering end faces 21 and 22, respectively, of the component base body 20.

As illustrated in FIGS. 2(a) and 2(b), the component base body 20 includes the magnetic body portion 50 in which the element main body 30 is buried. The third outer electrode 63 is exposed from the magnetic body portion 50 on the bottom face 24 of the component base body 20.

The element main body 30 includes the linear inner conductor 31 which includes the core portion 32, and the porous portion 33 having the pores 34 formed around the core portion 32. The periphery of the inner conductor 31 is covered by the dielectric layer 35. The dielectric layer 35 fills the pores 34 of the porous portion 33. Both end faces of the core portion 32 are exposed from the magnetic body portion 50, and are connected to the first outer electrode 61 and the second outer electrode 62, respectively.

The element main body 30 includes the conductor layer 40 arranged around the inner conductor 31. The conductor layer 40 includes the conductive polymer layer covering the inner conductor 31 and filling the pores 34 of the porous portion 33, the carbon layer 42 covering the conductive polymer layer 41, and the conductive resin layer 43 covering the carbon layer 42. The conductive resin layer 43 is electrically coupled to the third outer electrode 63.

In the element main body 30, a conductor portion 31a of the inner conductor 31 that is covered by the conductor layer 40, the dielectric layer 35, and the conductor portion 31a and the conductive polymer layer 41 sandwiching the dielectric layer 35 function as a capacitor in the radial direction of the inner conductor 31. The capacitance value of the capacitor is a value in accordance with the area of the conductor portion 31a and the conductive polymer layer 41 sandwiching the dielectric layer 35, and the thickness of the dielectric layer 35.

In the element main body 30, conductor portions 31b and 31c of the inner conductor 31 that are not covered by the conductor layer 40 are covered by the magnetic body portion 50 with the insulating layer 47 interposed therebetween. Therefore, the conductor portions 31b and 31c of the inner conductor 31 and the magnetic body portion 50 covering these conductor portions 31b and 31c function as inductors. The inductance value of portions functioning as the inductors is a value in accordance with the length of the conductor portion 31b between the conductor layer 40 and the first outer electrode 61, and the length of the conductor portion 31c between the conductor layer 40 and the second outer electrode 62.

One of two ends of the capacitor is connected to the core portion 32 of the inner conductor 31, and the other end of the capacitor is connected to the third outer electrode 63. One end of the above-mentioned capacitor is connected to the first outer electrode 61 with an inductor interposed therebetween, and is also connected to the second outer electrode 62 with an inductor interposed therebetween. That is, this electronic component 10 is a T-type LC composite component (LC composite filter) including one capacitor and two inductors.

As described above, according to the present embodiment, the following advantageous effects are achieved.

(1) The electronic component 10 includes the component base body 20 with first and second outer electrodes 61 and 62 covering respective end faces 21 and 22 of the component base body 20. The component base body 20 includes the element main body 30 and the magnetic body portion 50 covering the element main body 30. The element main body 30 includes the linear inner conductor 31, the dielectric layer 35 covering the periphery of part of the inner conductor 31, and the conductor layer 40 formed to cover the dielectric layer 35.

The dielectric layer 35 and the conductor layer 40 covering the periphery of part of the inner conductor 31, and the body portion of the inner conductor 31 covered by the dielectric layer 35 and the conductor layer 40 function as a capacitor. In addition, the magnetic body portion 50 and conductor portions of the inner conductor 31 covered by the magnetic body portion 50 function as inductors. Therefore, the electronic component 10 is an LC composite component including a capacitor and inductors. The capacitance value of the capacitor is determined by the size of the inner conductor 31, the dielectric layer 35, and the conductor layer 40. For this reason, the electronic component 10, that is, the capacitance value of the capacitor, does not depend on the size of the electronic component 10. Therefore, even when the electronic component 10 is miniaturized, it is not necessary to reduce the size of the dielectric layer 35 and the conductor layer 40, and desired characteristics can be obtained. In addition, because the conductor layer 40 is covered by a magnetic body, external physical stress is unlikely to be applied to the conductor layer 40.

(2) In the electronic component 10, the dielectric layer 35 is preferably an oxide film obtained by oxidizing the inner conductor 31. Therefore, the dielectric layer 35 can be easily formed around the inner conductor 31. In addition, because the oxide film is formed by oxidation, the dielectric layer 35 can be formed with a substantially uniform thickness around the inner conductor 31.

(3) In the electronic component 10, the magnetic body portion 50 is a composite material containing magnetic material powder and resin. Because the magnetic body portion 50 can be formed by heat processing, an assembly process as in the case of ferrite beads is unnecessary. In addition, the inner conductor 31 and the conductor layer 40 can be covered by the magnetic body portion 50 without gaps by performing heat processing after burying the inner conductor 31 and the like in the composite material.

(4) In the electronic component 10, the inner conductor 31 includes the core portion 32 extending in the axial direction of the inner conductor 31, and the porous portion 33 having the numerous pores 34 formed around at least part of the core portion 32. The dielectric layer 35 is formed to cover the porous portion.

According to this configuration, because the dielectric layer 35 is formed on the surface of the porous portion 33 having the numerous pores 34, the area of contact between the dielectric layer 35 and the inner conductor 31 becomes greater, thereby making it possible to increase the capacitance value of the capacitor.

(5) In the electronic component 10, the conductor layer 40 includes the conductive polymer layer 41 formed to cover the dielectric layer 35, and the conductive resin layer 43 connected to the third outer electrode 63. Therefore, because the conductive polymer layer 41 fills the numerous pores 34 of the porous portion 33, the area of contact between the conductive polymer layer 41 and the dielectric layer 35 becomes greater, thereby making it possible to increase the capacitance value of the capacitor.

(Modification)

Various modifications to the above embodiment are described, by way of example and not limitation, below. In this description, an element member that is the same as that in the above-described embodiment may be given the same reference numeral, and a description thereof may be partially or entirely omitted.

Although the inner conductor 31 in a linear shape whose cross section is circular is used in the above-described embodiment, the shape of the inner conductor may be changed as appropriate.

Figure 7A:
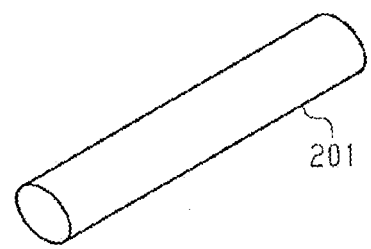
FIGS. 7(a) to 7(d) are perspective views illustrating inner conductors of modifications.
Figure 7B:
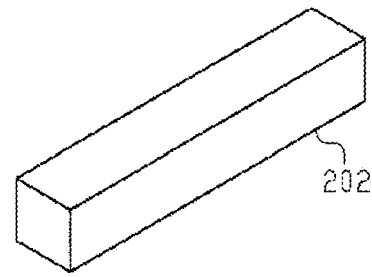

As illustrated in FIG. 7(a), an inner conductor 201 whose cross-sectional shape is oval may be used. Alternatively, as illustrated in FIG. 7(b), an inner conductor 202 whose cross-sectional shape is rectangular (such as square) may be used. These inner conductors 201 and 202 do not roll in the manufacturing process, and the orientation of the inner conductors 201 and 202 hardly changes, which makes it easier to maintain the placed state. For this reason, the manufacturing can be facilitated.

For example, in the case of using an inner conductor whose cross section is square with sides having the same length as the external dimension (diameter) of an inner conductor whose cross section is circular, the cross-sectional area becomes greater than that of the inner conductor whose cross section is circular, thereby making it possible to increase the amount of current flowing through the electronic component. In addition, because the surface area becomes greater, the capacitance value of the capacitor can be increased.

In addition, part of the cross-sectional shape of the inner electrode may be changed.

Figure 7C:
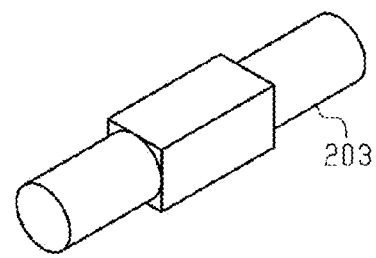

As illustrated in FIG. 7(c), an inner conductor 203 in which the cross-sectional shape of a central portion is rectangular (such as square), and the cross-sectional shape on both sides is circular may be used. It becomes easier to maintain the placed state in a portion where the cross section is rectangular, and the manufacturing can be facilitated. In addition, because the surface area becomes greater, the capacitance value of the capacitor can be increased.

Figure 7D:
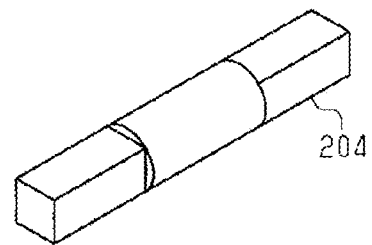

As illustrated in FIG. 7(d), an inner conductor 204 in which the cross-sectional shape of a central portion is circular, and the cross-sectional shape on both sides is rectangular may be used.

Note that, in the inner conductor, the shape of the cross section orthogonal to the axial direction may be triangular or polygonal such as pentagonal, besides the above-described circular, rectangular (square), and oval. In addition, it is preferable that the cross-sectional shape be one that partially has a straight line.

Figure 8:
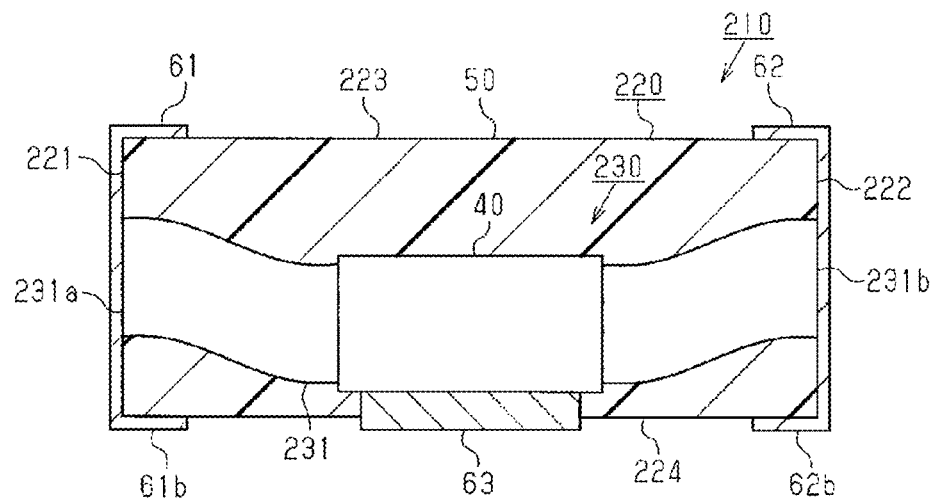
FIG. 8 is a cross-sectional view illustrating an electronic component of a modification.

An electronic component 210 illustrated in FIG. 8 includes a component base body 220, and first and second outer electrodes 61 and 62 covering respective end faces 221 and 222 of the component base body 220. The first and second outer electrodes 61 and 62 are formed to cover part of the side faces and the top and bottom faces 223 and 224 of the component base body 220. The component base body 220 includes an element main body 230, and the magnetic body portion 50 covering the element main body 230. The element main body 230 includes an inner conductor 231, and the conductor layer 40 covering the periphery of part of the inner conductor 231. The inner conductor 231 is formed such that the conductor layer 40 covering the periphery of part of the inner conductor 231 contacts the third outer electrode 63, and is formed to be curved such that both end faces 231a and 231b are substantially at the center of the end faces 221 and 222 of the component base body 220. The inner conductor 231 formed in this manner is such that the distance between both end portions and the side-face electrodes 61b and 62b of the first outer electrode 61 and the second outer electrode 62 formed on the side faces of the component base body 220 is longer than that in the case where the inner conductor 231 is linear. When the distance between the inner conductor 231 and the side-face electrodes 61b and 62b is short, a parasitic capacitor is generated between them. The parasitic capacitor reduces the inductance value of an inductor including the inner conductor 231 covered by the magnetic body portion 50. In other words, the inductance value obtained in accordance with the length of the inner conductor 231 is reduced. For this reason, as illustrated in FIG. 8, the inductance value can be increased, that is, the efficiency of obtaining the inductance value in accordance with the length of the inner conductor 231, can be improved by curving the inner conductor 231. In addition, ESL can be minimized by having the conductor layer 40 in contact with the third outer electrode 63, thereby improving the noise removal characteristics.

Figure 9:
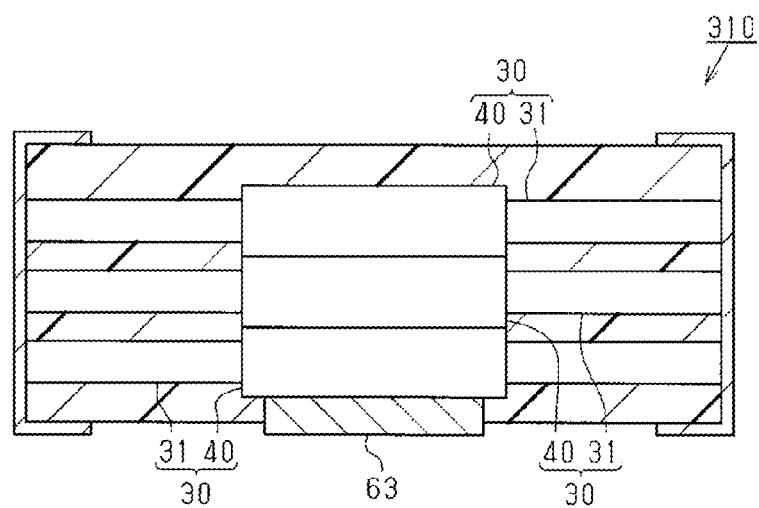
FIG. 9 is a cross-sectional view illustrating an electronic component of a modification.

An electronic component 310 illustrated in FIG. 9 includes a plurality of element main bodies 30. Each element main body 30 includes the inner conductor 31, and the conductor layer 40 covering the periphery of part of the inner conductor 31. Each conductor layer 40 and the third outer electrode 63 are electrically coupled by a bonding material (such as a conductive adhesive). The capacitance value of the electronic component 310 can be increased because a plurality of element main bodies 30 are used.

Figure 10:
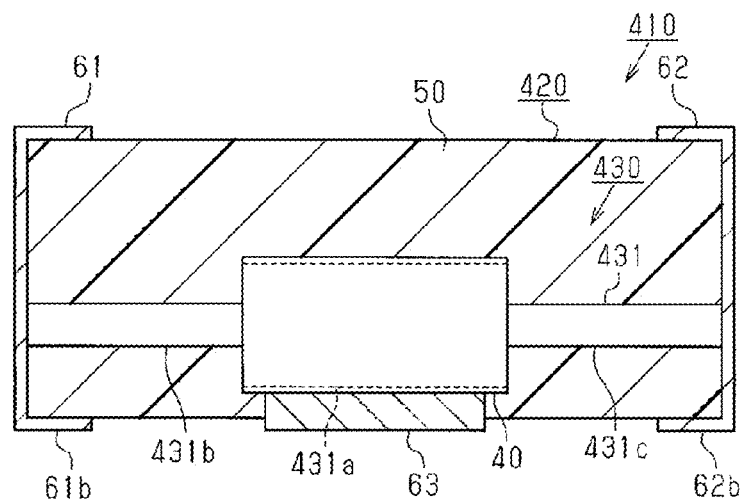
FIG. 10 is a cross-sectional view illustrating an electronic component of a modification.

An electronic component 410 illustrated in FIG. 10 includes a component base body 420 and the first and second outer electrodes 61 and 62. The component base body 420 includes an element main body 430 and a magnetic body portion 50 covering the element main body 430. The element main body 430 includes an inner conductor 431 and a conductor layer 40 covering the periphery of part of the inner conductor 431. The inner conductor 431 is formed such that the size (diameter) of a conductor portion 431a covered by the conductor layer 40 is larger than conductor portions 431b and 431c covered by the magnetic body portion 50. In this manner, the area of the conductor portion 431a and the conductor layer 40 (conductive polymer layer) sandwiching the dielectric layer becomes greater by enlarging the conductor portion 431a covered by the conductor layer 40, thereby increasing the capacitance value. In addition, by enlarging the conductor portion 431a covered by the conductor layer 40 and thinning the conductor portions 431b and 431c covered by the magnetic body portion 50, the conductor layer 40 can be brought into contact with the third outer electrode 63, and the conductor portions 431b and 431c of the inner conductor 431 can be separated from the side-face electrodes 61b and 62b of the first outer electrode 61 and the second outer electrode 62. Accordingly, ESL can be reduced, and the efficiency of obtaining the inductance value can be improved.

Figure 11:
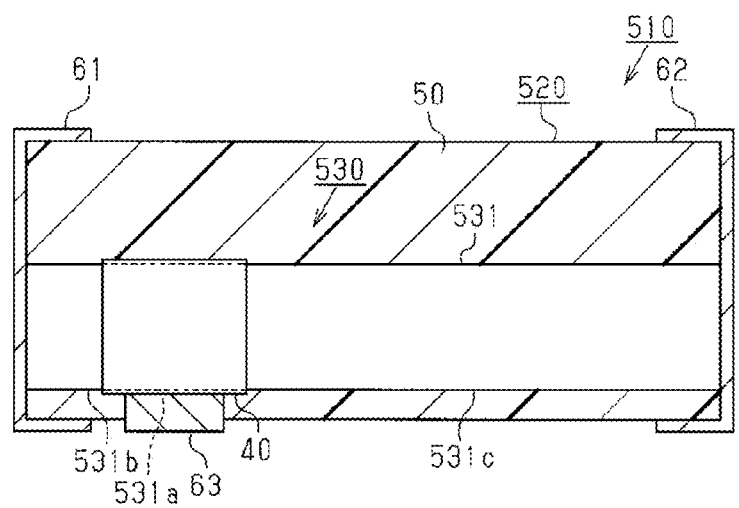
FIG. 11 is a cross-sectional view illustrating an electronic component of a modification.

An electronic component 510 illustrated in FIG. 11 includes a component base body 520, and the first outer electrode 61 and the second outer electrode 62. The component base body 520 includes an element main body 530, and the magnetic body portion 50 covering the element main body 530. The element main body 530 includes an inner conductor 531, and the conductor layer 40 covering the periphery of part of the inner conductor 531. In this electronic component 510, the conductor layer 40 is formed to cover the periphery of a portion close to one end portion of the inner conductor 531. The conductor layer 40 is electrically coupled to the third outer electrode 63.

In the inner conductor 531, a conductor portion 531a covered by the conductor layer 40 and the conductor layer 40 function as a capacitor, as in the above-described embodiment. In the inner conductor 531, a conductor portion 531c between the conductor layer 40 and the second outer electrode 62 is covered by the magnetic body portion 50, and functions as an inductor, as in the above-described embodiment. In contrast, in the inner conductor 531, a conductor portion 531b between the conductor layer 40 and the first outer electrode 61 functions as a general conductor because the conductor portion 531b has a short conductive path length and a much smaller inductance value than the above-mentioned conductor portion 531c. Therefore, the electronic component 510 serves as an L-type LC composite component (LC composite filter) containing an inductor connected between the first outer electrode 61 and the second outer electrode 62 and a capacitor connected between one terminal of the inductor and the third outer electrode 63.

Figure 12:
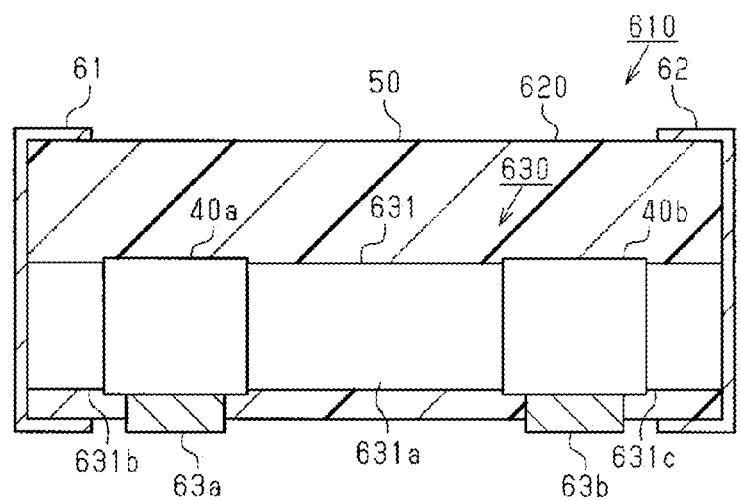
FIG. 12 is a cross-sectional view illustrating an electronic component of a modification.

An electronic component 610 illustrated in FIG. 12 includes a component base body 620, and the first outer electrode 61 and the second outer electrode 62. The component base body 620 includes an element main body 630, the magnetic body portion 50 covering the element main body 630, and two third outer electrodes 63a and 63b. The element main body 630 includes an inner conductor 631, and two conductor layers 40a and 40b. The conductor layer 40a is positioned near the first outer electrode 61, and is formed to cover the periphery of part of the inner conductor 631. The conductor layer 40b is positioned near the second outer electrode 62, and is formed to cover the periphery of part of the inner conductor 631. The conductor layers 40a and 40b are electrically coupled to the third outer electrodes 63a and 63b, respectively.

In the inner conductor 631, a conductor portion covered by the conductor layer 40a and the conductor layer 40a function as a capacitor. Similarly, a conductor portion covered by the conductor layer 40b functions as, with the conductor layer 40b, a capacitor.

In the inner conductor 631, a conductor portion 631a between both conductor layers 40a and 40b has a long conductive path length and functions as an inductor. A conductor portion 631b between the first outer electrode 61 and the conductor layer 40a functions as a general conductor because the conductor portion 631b has a short conductive path length and a much smaller inductance value than the above-mentioned conductor portion 631a. Similarly, a conductor portion 631c between the second outer electrode 62 and the conductor layer 40b functions as a general conductor because the conductor portion 631c has a short conductive path length and a much smaller inductance value than the above-mentioned conductor portion 631a.

Therefore, the electronic component 610 serves as a Π-type LC composite component (LC composite filter) containing an inductor connected between the first outer electrode 61 and the second outer electrode 62 and capacitors respectively connected between both terminals of the inductor and the third outer electrodes 63a and 63b.

Figure 13:
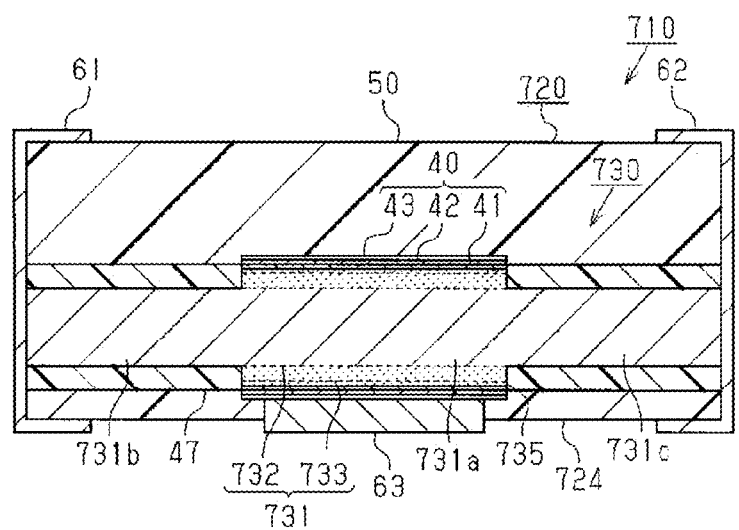
FIG. 13 is a cross-sectional view illustrating an electronic component of a modification.

An electronic component 710 illustrated in FIG. 13 includes a component base body 720, and the first outer electrode 61 and the second outer electrode 62. The component base body 720 includes an element main body 730, and the magnetic body portion 50 covering the element main body 730. The element main body 730 includes an inner conductor 731, and the conductor layer 40 covering the periphery of part of the inner conductor 731.

The inner conductor 731 includes a core portion 732 extending in the axial direction (length direction L) of the inner conductor 731, and a porous portion 733 formed around part of the core portion 732. The porous portion 733 has many pores. A conductor portion 731a where the porous portion 733 is formed is covered by the conductor layer 40. In this modification, the porous portion 733 is formed in an area corresponding to the conductor layer 40, and no porous portion is formed from the conductor layer 40 to both end portions of the inner conductor 731. A dielectric layer 735 is formed on the surface of the porous portion 733. In other words, the porous portion 733 is covered by the dielectric layer 735 and the conductor layer 40 (conductive polymer layer 41, carbon layer 42, and conductive resin layer 43). The conductor layer 40 is electrically coupled to the third outer electrode 63.

In the inner conductor 731, conductor portions 731*b* and 731*c* where the porous portion 733 is not formed are covered by the insulating layer 47. These conductor portions 731*b* and 731*c* are the core portion 732 of the inner conductor 731. In other words, the core portion 732 is covered by the insulating layer 47 at both ends of the inner conductor 731.

In this electronic component 710, the dielectric layer 735 is not formed in the conductor portions 731*b* and 731*c* of the inner conductor 731 that are covered by the insulating layer 47. For this reason, the dielectric layer 735 does not overlap the first outer electrode 61 and the second outer electrode 62 in a direction perpendicular to the mounting face (face parallel to a bottom face 724 of the component base body 720). For this reason, no parasitic capacitance is generated between the dielectric layer 735 and the first outer electrode 61, and between the dielectric layer 735 and the second outer electrode 62. A parasitic capacitance causes RF noise to pass from the first outer electrode 61 or the second outer electrode 62 to the dielectric layer 735, and reduces the effect of the inductor. Therefore, a parasitic capacitance is suppressed from being generated in the electronic component 710, thereby suppressing the reduction of the effect of the inductor.

Figure 14A:
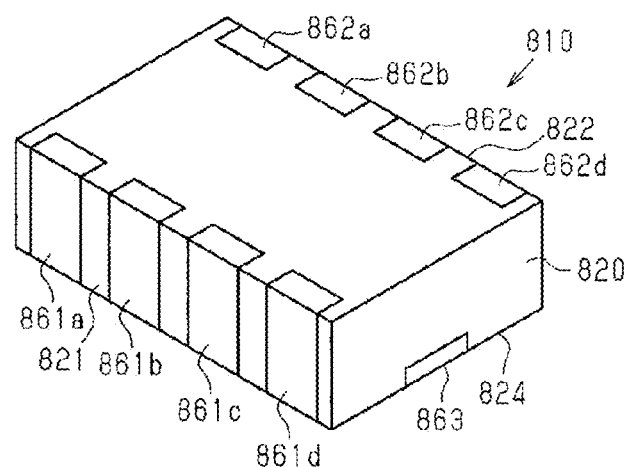
FIG. 14(a) is a perspective view illustrating an electronic component of a modification.
Figure 14B:
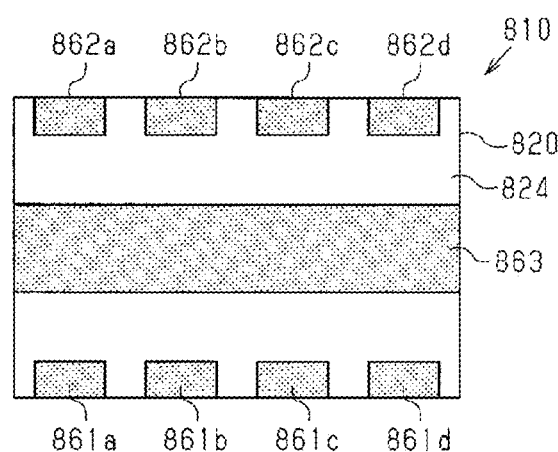
FIG. 14(b) is a bottom view of the electronic component of the modification.
Figure 14C:
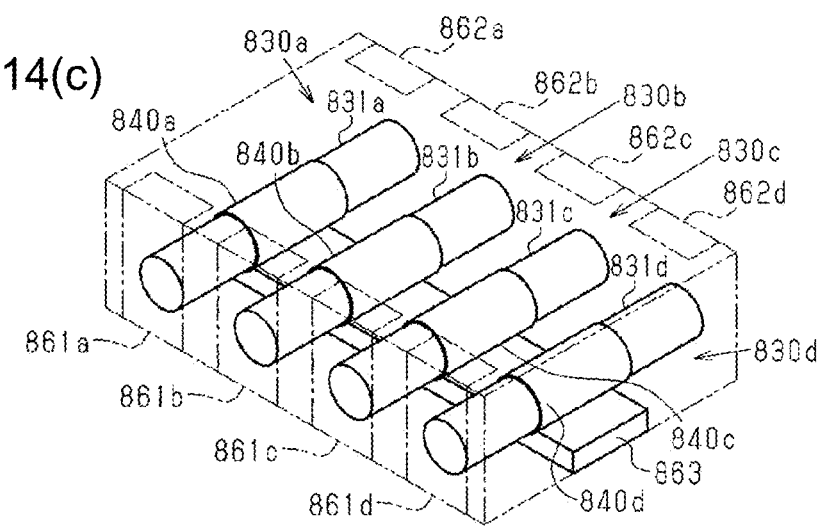
FIG. 14(c) is a perspective view illustrating a schematic structure of the modification.

As illustrated in FIGS. 14(*a*) and 14(*b*), an electronic component 810 includes a component base body 820 formed in a rectangular shape, and four first outer electrodes 861*a*, 861*b*, 861*c*, and 861*d* and four second outer electrodes 862*a*, 862*b*, 862*c*, and 862*d* on a pair of end faces 821 and 822 of the component base body 820 that face each other. The component base body 820 includes a third outer electrode 863 on its bottom face 824.

As illustrated in FIG. 14(*c*), the component base body 820 includes four element main bodies 830*a*, 830*b*, 830*c*, and 830*d*. The element main bodies 830*a*, 830*b*, 830*c*, and 830*d* include inner conductors 831*a*, 831*b*, 831*c*, and 831*d*, and conductor layers 840*a*, 840*b*, 840*c*, and 840*d* covering the periphery of part of the inner conductors 831*a*, 831*b*, 831*c*, and 831*d*. Both end portions of the inner conductor 831*a* are electrically coupled to the first outer electrode 861*a* and the second outer electrode 862*a*. Similarly, both end portions of the inner conductors 831*b*, 831*c*, and 831*d* are electrically coupled to the first outer electrodes 861*b*, 861*c*, and 861*d* and the second outer electrodes 862*b*, 862*c*, and 862*d*, respectively. The conductor layers 840*a*, 840*b*, 840*c*, and 840*d* are electrically coupled to the third outer electrode 63.

Each of the element main bodies 830*a* to 830*d* functions as a T-type LC composite element (LC composite filter), as in the above-described embodiment. Therefore, the electronic component 810 is an array device (array filter) containing four T-type LC composite elements (LC composite filters).

Although the continuous inner conductors 31 are arranged on the resin sheet 102, as illustrated in FIG. 6(*a*), in the above-described embodiment, the cut individual inner conductors 31 may be arranged.

Although the component base body 20 has a substantially rectangular parallelepiped shape in the above-described embodiment, the component base body 20 may have a column shape whose end face is triangular, polygonal greater than or equal to pentagonal, circular, or the like. Similarly, in each of the modifications, the component base body may have a column shape whose end face is triangular, polygonal greater than or equal to pentagonal, circular, or the like.

REFERENCE SIGNS LIST

10 . . . electronic component
20 . . . component base body
30 . . . element main body
31 . . . inner conductor
35 . . . dielectric layer
40 . . . conductor layer
50 . . . magnetic body portion
61 . . . first outer electrode
62 . . . second outer electrode
63 . . . third outer electrode

The invention claimed is:

1. An electronic component comprising:
a linear inner conductor having first and second end faces;
a dielectric layer on a surface of the inner conductor;
a conductor layer covering the dielectric layer;
a magnetic body portion covering the conductor layer and peripheral portions of the inner conductor;
first and second outer electrodes electrically coupled to the first and second end faces of the inner conductor, respectively; and
a third outer electrode electrically coupled to the conductor layer.

2. The electronic component according to claim 1, wherein the dielectric layer is an oxide film.

3. The electronic component according to claim 2, wherein the dielectric film is obtained by oxidizing an outer surface of the inner conductor.

4. The electronic component according to claim 1, wherein the magnetic body portion is a composite material containing magnetic material powder and thermosetting resin.

5. The electronic component according to claim 1, wherein:
the inner conductor includes a core portion extending in an axial direction of the inner conductor and a porous portion having numerous pores formed around at least part of the core portion; and
the dielectric layer covers the porous portion.

6. The electronic component according to claim 5, wherein the conductor layer includes a conductive polymer layer covering the dielectric layer and a conductive resin layer coupled to the third outer electrode.

7. The electronic component according to claim 1, further comprising an insulating layer covering a periphery of the inner conductor which extends from the conductor layer to an end portion of the inner conductor, the magnetic body portion covering both the conductor layer and the insulating layer.

8. The electronic component according to claim 7, wherein:
the insulating layer is a first insulating layer;
the end portion of the inner conductor is the first end portion of the inner conductor;
the electronic component further comprises a second insulating layer covering a periphery of the inner conductor which extends from the conductor layer to the second end portion of the inner conductor; and
the magnetic body portion covers the second insulating layer.

9. The electronic component according to claim 1, wherein the magnetic body portion includes first and second end faces and at least one side face extending between the first and second end faces of the magnetic body portion, the first and second end faces of the inner conductor being exposed at the first and second end faces of the magnetic body portion, respectively.

10. The electronic component according to claim 9, wherein:
the electronic component has an axis which extends through the first and second outer electrodes;
the first outer electrode includes a first end-face electrode covering the first end face of the magnetic body portion and a first side-face electrode extending from the first end face electrode and covering a portion of at least one of the side faces of the at least one side face the magnetic body portion;
the second outer electrode including a second end-face electrode covering the second end face of the magnetic body portion and a second side-face electrode extending from the second end face electrode and covering a portion of at least one of the at least one side face of the magnetic body portion; and
the dielectric layer does not overlap the first and second side-face electrodes when viewed in a direction orthogonal to the axis of the electronic component.

11. The electronic component according to claim 10, wherein the at least one side face of the magnetic body portion is a plurality of side faces and each of the first and second side-face electrodes extend from the first and second end face electrodes, respectively, onto respective portions of the each of the plurality of side faces of the first outer electrode.

12. The electronic component according to claim 1, wherein:
the conductor layer is in contact with the third outer electrode; and
the inner conductor is bent such that the first and second end faces of the inner conductor are positioned at a center of the first and second outer electrodes.

13. The electronic component according to claim 12, wherein the electronic component has a central axis which extends through the center of the first and second outer electrodes and a center region of the inner conductor is located at a position offset from the central axis.

14. The electronic component according to claim 1, wherein the third outer electrode is located on an outer portion of the electronic component located between the first and second outer electrodes.

15. The electronic component according to claim 1, wherein the electronic component is an LC circuit.

16. The electronic component of claim 1, wherein the electronic component has a central axis that passes through the first and second outer electrodes and does not pass through the third outer electrode, the conductive layer having a central axis that is parallel to the central axis of the electronic component and a center of the conductive layer is closer to first outer electrode than the second outer electrode as measured along the central axis.

* * * * *